(12) United States Patent
Newman et al.

(10) Patent No.: US 6,360,434 B1
(45) Date of Patent: Mar. 26, 2002

(54) CIRCUIT FABRICATION

(75) Inventors: R. Thomas Newman, Shelburne Falls; Ronald A. Vanden Dolder, Sunderland, both of MA (US)

(73) Assignee: Telaxis Communications Corporation, South Deerfield, MA (US)

( * ) Notice: Subject to any disclaimer, the term of this patent is extended or adjusted under 35 U.S.C. 154(b) by 0 days.

(21) Appl. No.: 09/510,790

(22) Filed: Feb. 23, 2000

(51) Int. Cl.[7] .............................. H05K 3/34; B32B 3/00
(52) U.S. Cl. .............................. 29/848; 29/852; 216/13; 216/17; 216/18
(58) Field of Search .............................. 216/13, 17, 18; 29/846, 848, 852

(56) References Cited

U.S. PATENT DOCUMENTS

| | | | |
|---|---|---|---|
| 3,990,926 A | 11/1976 | Konicek | 156/3 |
| 4,053,370 A | 10/1977 | Yamashita et al. | 204/13 |
| 4,104,111 A * | 8/1978 | Mack | 216/18 |
| 4,325,780 A * | 4/1982 | Schulz, Sr. | 216/17 |
| 4,444,619 A | 4/1984 | O'Hara | 156/645 |
| 4,605,471 A * | 8/1986 | Mitchell | 216/18 |
| 4,925,525 A | 5/1990 | Oku et al. | 156/652 |
| 5,733,468 A | 3/1998 | Conway, Jr. | 216/21 |

* cited by examiner

Primary Examiner—Randy Gulakowski
Assistant Examiner—Shamim Ahmed
(74) Attorney, Agent, or Firm—Hamilton, Brook, Smith & Reynolds, PC

(57) ABSTRACT

A method of forming a circuit includes forming a metallic circuit pattern on a base substrate. The circuit pattern has traces which are connected together by temporary bussing. A resist pattern for defining at least one terminal pad is formed over the circuit pattern. A layer of metal is formed on at least one area of the circuit pattern exposed by the resist pattern to a thickness suitable for serving as the at least one terminal pad for the circuit. A portion of the base substrate at the location of the temporary bussing is removed thereby causing the removal of the temporary bussing.

22 Claims, 5 Drawing Sheets

CIRCUIT FABRICATION

BACKGROUND OF THE INVENTION

Electronic circuits included on circuit boards often have thickened metallized areas serving as terminal pads which allow electrical devices to be wire bonded thereto. Conventional methods for forming such circuits usually involve forming a photoresist pattern on a copper clad circuit board substrate and electro-plating a thick patterned layer of copper over the copper cladding. Areas of copper are etched away to produce a desired circuit pattern on the circuit board substrate. The thickened areas of the circuit are suitable for wire bonding to electronic devices.

A drawback with such a method is that etching the unneeded areas of copper from the circuit board substrate usually requires a relatively long etching process due to the thickened layers of metal. As a result, the side edges of the circuit pattern often become undercut and/or ragged which can affect the performance of the circuit. In addition, temporary bussing pathways may be formed to provide electrical continuity between different portions of the circuit board substrate or between opposite sides thereof. The electrical continuity is required for providing electrical current to areas where the deposition of metallic material by electroplating or electrolytic deposition is desired. The temporary bussing pathways are later etched away in another etching process. The added etching process may affect the quality of the side edges of the remaining portions of the circuit pattern.

SUMMARY OF THE INVENTION

The present invention provides a method of forming a circuit on a circuit board including thickened areas suitable for wire bonding to electrical devices where the traces of the circuit have limited undercutting and can be manufactured with higher tolerances than possible with previous methods. The method includes forming a metallic circuit pattern on a base substrate. The circuit pattern has traces which are connected together by temporary bussing. A resist pattern is formed over the circuit pattern for defining at least one terminal pad. A layer of metal is formed on at least one area of the circuit pattern exposed by the resist pattern to a thickness suitable for serving as the at least one terminal pad for the circuit. A portion of the base substrate at the location of the temporary bussing is removed, thereby causing the removal of the temporary bussing.

In preferred embodiments, the metallic circuit pattern is formed by forming a first resist pattern for defining the circuit pattern over a metallic layer on the base substrate. Areas of the metallic layer on the base substrate exposed by the first resist pattern are etched away thereby forming the metallic circuit pattern under the first resist pattern. The first resist pattern is then stripped from the base substrate to uncover the circuit pattern. The circuit pattern and its side edges are covered with a protective metallic layer. The protective metallic layer is formed by forming a metallic inner barrier layer over the circuit pattern and side edges thereof by electroless deposition and then forming a metallic outer layer over the barrier layer also by electroless deposition.

The base substrate preferably has opposing sides each with a metallic layer thereon. In such a case, before forming the metallic circuit pattern, at least one via hole is formed through the base substrate. A conductive pathway is formed through the at least one via hole to provide electrical continuity between the metallic layers on the opposing sides of the base substrate. The conductive pathway later becomes part of the temporary bussing when the circuit pattern is formed. The conductive pathway may be formed by first forming a thin metallic layer within the at least one via hole and over the metallic layers of the base substrate by electroless deposition, and then forming a thick metallic layer over the thin layer as well as within the at least one via hole by electrolytic deposition. The metallic layer which forms the at least one terminal pad is deposited by electrolytic deposition.

In one embodiment, the metallic layers of the base substrate which are on opposing sides of the base substrate are made of copper. The conductive pathway is formed by first forming a thin copper layer within the at least one via hole and over the copper layers of the base substrate by electroless copper deposition, and then forming a thick copper layer over the thin layer by electrolytic copper deposition. Consequently, after etching, the resulting metallic circuit pattern is made of copper. The protective metallic layer is formed by forming an inner barrier layer of nickel over the circuit pattern and side edges thereof by electroless nickel deposition and then forming an outer layer of gold over the inner barrier layer of nickel by electroless gold deposition. The terminal pads are formed by electrolytic gold deposition. Finally, the temporary bussing is routed out with a router.

In another embodiment, the metallic circuit pattern is formed by providing the base substrate with a metallic layer thereon. A first resist pattern is formed over the metallic layer on the base substrate for defining the circuit pattern. Next, the thickness of the metallic layer is increased in areas of the base substrate exposed by the first resist pattern. The thickened metallic layer in the areas exposed by the first resist pattern is later covered with a protective metallic layer. The first resist pattern is then stripped from the base substrate. Finally, areas of the base substrate not protected by the protective metallic layer are etched from the base substrate, thereby forming the metallic circuit pattern.

In the present invention, since the circuit pattern is etched before the thick layer of metal forming the terminal pads is deposited, the etching is performed on a relatively thin layer of metal for a relatively short period of time. As a result, the side edges of the traces of the circuit pattern once formed, are not subjected to a lengthy attack by the etchant and experience very little etching and/or undercutting. In addition, by removing the temporary bussing by routing, the circuit pattern is not subjected to any further etching steps, thereby preserving the quality of the side edges of the traces. Consequently, the present invention is suitable for forming very fine and delicate traces with high yield as well as with high performance.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
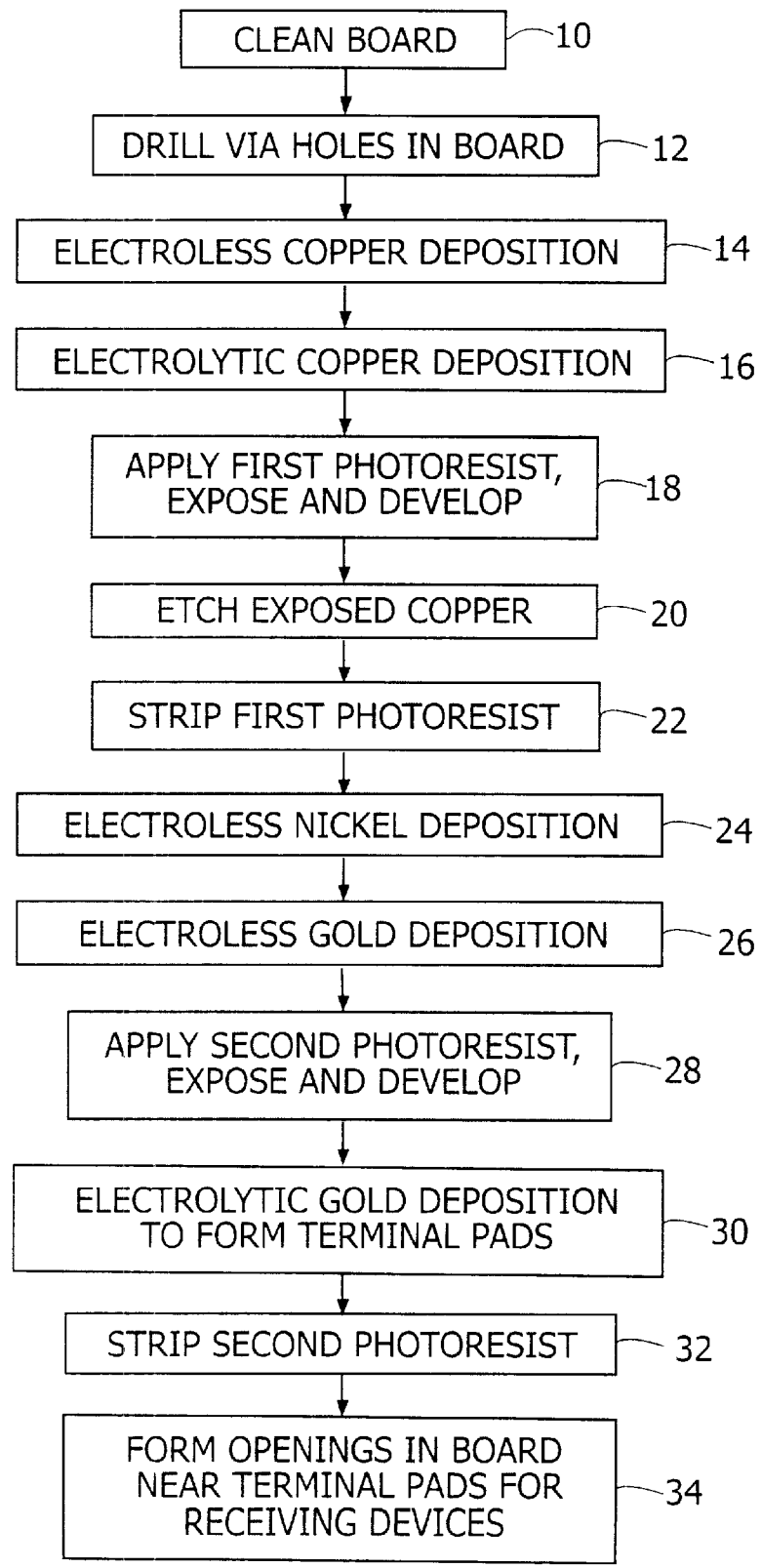
FIG. 1 is a flow chart depicting the steps of one method for fabricating electronic circuits in accordance with the present invention.
Figure 5:
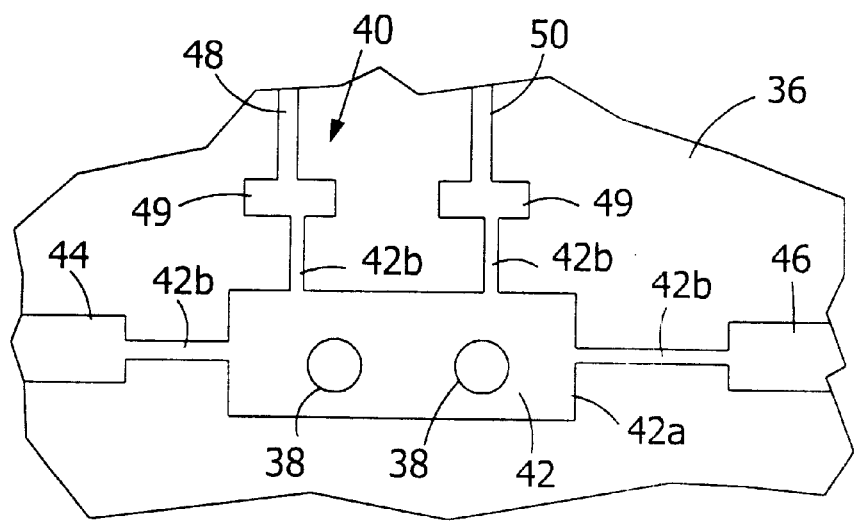
FIG. 5 is a plan view of a portion of the circuit board substrate having a metallized circuit pattern defined thereon, including temporary bussing pathways.

FIG. 1 depicts the steps of one method for forming a circuit in accordance with the present invention. In step 10, a conventional circuit board substrate 36 (FIG. 2) having thin metallic base layers 36a covering opposing sides is provided. Typically, the metallic layers 36a are formed of copper. The metallic layers 36a are cleaned in a cleaning process in preparation for subsequent processes. In step 12, a series of via holes 38 are formed through substrate 36 and metallic layers 36a (FIGS. 2 and 5) at predetermined locations. The via holes 38 are preferably drilled, but alternatively, may be punched, stamped or formed by a laser. Typically, the via holes 38 are positioned on substrate 36 adjacent to a location where an opening in substrate 36 will be later located. The position of the via holes 38 is also at the future location of temporary bussing 42 (FIG. 5). The temporary bussing 42 is later removed and an electrical device positioned at the same location. Typically two via holes 38 are formed at the future location of temporary bussing 42, but alternatively, the number of via holes 38 may vary depending upon the situation at hand.

Figure 2:
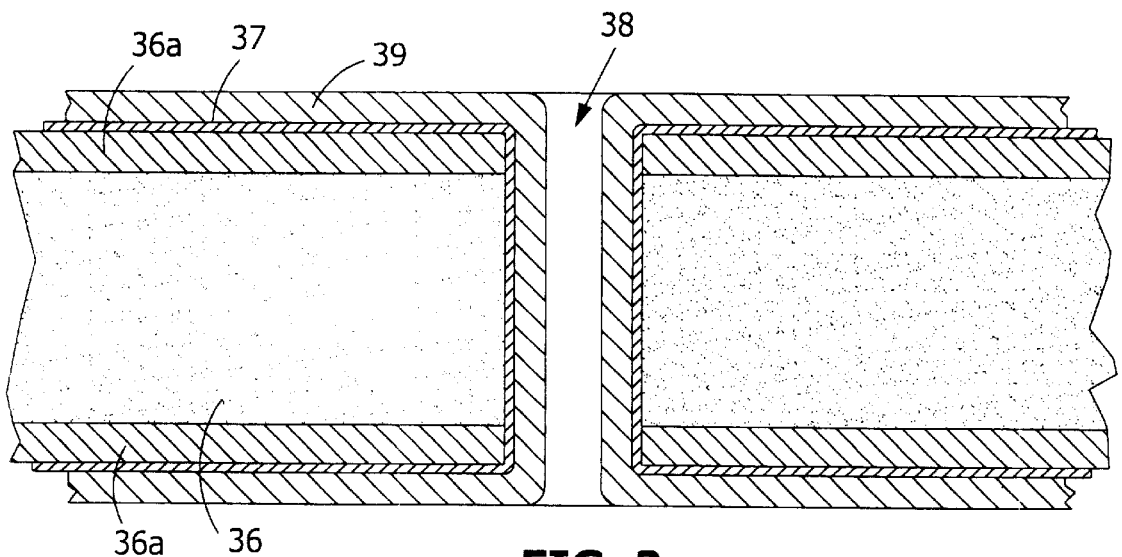
FIG. 2 is a side sectional view of a portion of a circuit board substrate having a via hole depicting deposited metallized layers.

In step 14 (FIG. 1), a thin metallic layer of copper 37 is deposited over the metallic layers 36a of substrate 36 as well as over the inner surfaces of via holes 38 (FIG. 2). The thin layer of copper 37 is typically formed in a bath by electroless copper deposition. The portion of layer 37 extending through the via holes 38 provides electrical continuity between the two separated layers of copper 36a. Although layer 37 is preferably formed by electroless deposition, alternatively, layer 37 may be formed by other suitable methods such as vapor deposition.

Typically, layer 37 is too thin to survive subsequent processing steps. As a result, in step 16 (FIG. 1), a thicker metallic layer of copper 39 (FIG. 2) is deposited over the thin layer 37 by electrolytic copper deposition in a electrolyte bath where the copper surfaces are electrically connected to a power source and current passed therethrough. Electrical continuity to the copper surfaces on both sides of substrate 36 is provided by the thin layer of copper 37 within the via holes 38 which permits the electrolytic deposition of copper on both sides of substrate 36 as well as within the via holes 38. Electrolytic deposition is able to deposit a thicker layer of copper 39 than the layer 37 formed by electroless deposition. The copper layer 39 within the via holes 38 has a thickness that is sufficient to survive subsequent processes and thus maintain electrical continuity to both sides of substrate 36.

Figure 3:
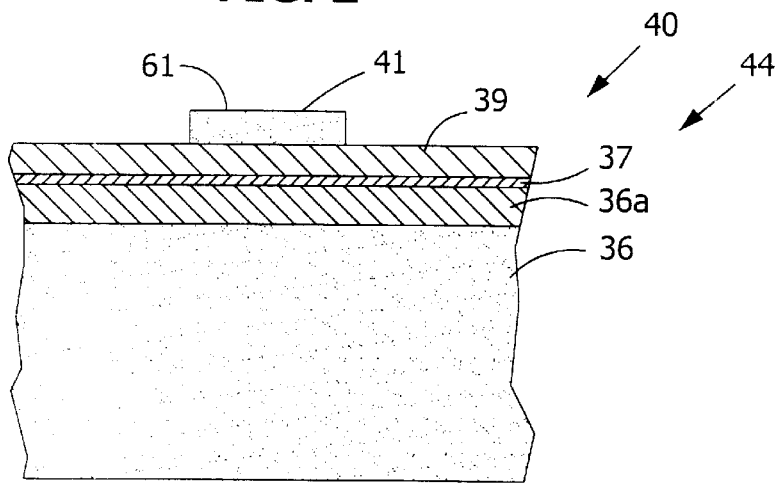
FIG. 3 is a side sectional view of a portion of the circuit board substrate depicting a first pattern of photoresist formed over the metallized layers.

In Step 18 (FIG. 1), a first photoresist layer 61 (FIG. 3) is deposited over one or both of the copper layers 39 as desired. Patterns of desired circuits are formed from the photoresist by conventional exposure and development processes. The patterns provide masks for forming the desired circuits. Such circuit patterns may be formed on one or both sides of substrate 36 depending upon the application at hand. FIG. 3 depicts a portion of a pattern 41 of photoresist formed on layer 39.

Figure 4:
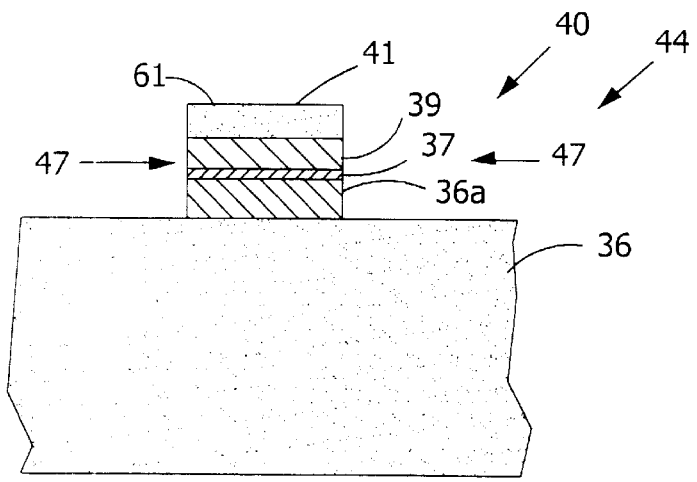
FIG. 4 is a side sectional view of the portion of the circuit board substrate of FIG. 3 depicting metallized areas surrounding the first photoresist pattern removed by etching to form a metallized circuit pattern.

In step 20 (FIG. 1), the copper material which is not covered by the photoresist pattern 41 is etched away in an etching bath to form a copper circuit pattern 40 consisting of layers 36a, 37 and 39 (FIG. 4). The side edges 47 of circuit pattern 40 have the added thicknesses of layers 36a, 37 and 39. The photoresist pattern 41 is then stripped away in step 22 with an appropriate solution in a stripping bath. In the example depicted in FIG. 5, the circuit pattern 40 includes a first radio frequency trace 44, a second radio frequency trace 46, a first DC trace 48, a second DC trace 50 and temporary bussing 42 connected therebetween. The traces 44 and 46 are on opposite sides of temporary bussing 42, while traces 48 and 50 are side by side between traces 44/46. In the example shown, traces 48 and 50 are relatively narrow in comparison to traces 44 and 46. As a result, traces 48 and 50 include widened regions 49 over which terminal pads will later be formed for bonding to an electrical device. FIG. 4 depicts a cross sectional view of the portion of circuit pattern 40 forming trace 44. The temporary bussing 42 extends around and includes the two metallized via holes 38, a central rectangular region 42a and a series of narrow traces 42b extending from rectangular region 42a to traces 44, 46, 48 and 50. The temporary bussing 42 provides electrical continuity between the traces 44, 46, 48 and 50 of circuit pattern 40. In addition, temporary bussing 42 provides electrical continuity between circuit pattern 40 and any circuit patterns or metallic areas located on the opposite side of substrate 36. Although not shown in FIG. 5, temporary bussing 42 may be employed to provide electrical continuity to circuit patterns adjacent to circuit pattern 40 on the same side of substrate 36. In such a case, another trace would extend therebetween. It is understood that circuit pattern 40 may be of other suitable configurations depending upon the application at hand. It is also understood that other circuit patterns may be formed on the same and/or opposite side of substrate 36.

Figure 6:
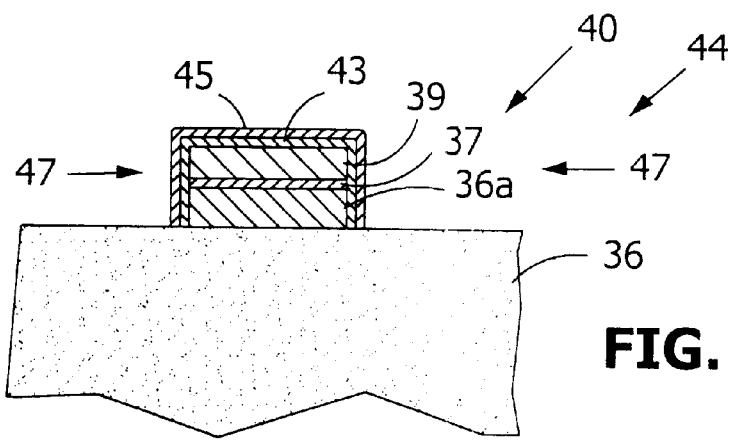
FIG. 6 is a side sectional view of the portion of the circuit board substrate of FIG. 3 depicting protective metallic layers covering the circuit pattern.

In step 24 (FIG. 1), a thin layer of nickel 43 (FIG. 6) is deposited over the circuit pattern 40 in a bath by electroless nickel deposition. The layer of nickel 43 covers the top surfaces as well as the side edges 47 of circuit pattern 40. Next, in step 26, a thin layer of gold 45 is deposited over the layer of nickel 43 by electroless gold deposition and also covers the top surfaces and side edges 47. The layers of nickel 43 and gold 45 are deposited only over circuit pattern 40 and not over non-metallic areas of substrate 36. The combined layers of nickel 43 and gold 45 serve as a protective metallic layer or jacket for protecting the top surfaces and side edges 47 of circuit pattern 40 which prevents or reduces etching as well as undercutting during subsequent processing steps. The layer of nickel 43 acts as a barrier layer between the copper and the gold layers to prevent migration between the copper and the gold layers.

Figure 7:
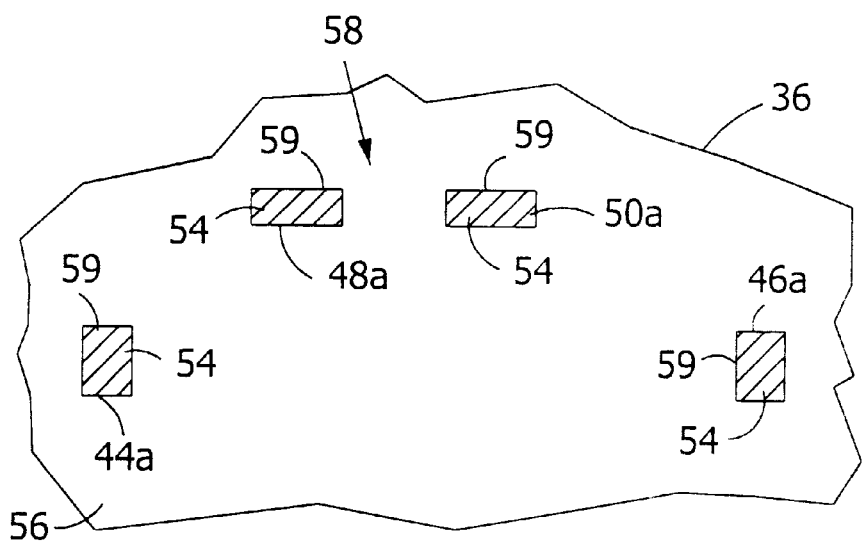
FIG. 7 is a plan view of the portion of the circuit board substrate of FIG. 5 depicting a second pattern of photoresist and terminal pads formed thereon.

In step 28 (FIG. 1), a second layer of photoresist 56 (FIG. 7) is deposited upon substrate 36 and over circuit pattern 40. The second layer of photoresist 56 is exposed and developed by conventional methods for forming a pattern 58 of open areas 59. The areas 59 correspond to desired locations for forming terminal pads for circuit pattern 40. In step 30, a layer of gold 54 is deposited by electrolytic gold deposition in an electrolytic bath over portions of circuit pattern 40 exposed by the open areas 59 of the photoresist pattern 58. The electrolytic layer of gold 54 is positioned on the appropriate areas of circuit pattern 40 to form terminal pads 44*a*, 46*a*, 48*a* and 50*a* for respective traces 44, 46, 48 and 50. Layer 54 is formed to a thickness suitable for bonding to electrical devices. The temporary bussing 42 including via holes 38, provide the necessary electrical continuity within circuit pattern 40 and to other circuit patterns or metallized areas if any, including those on the opposite side of circuit board substrate 36 for the electrolytic gold deposition.

Figure 8:
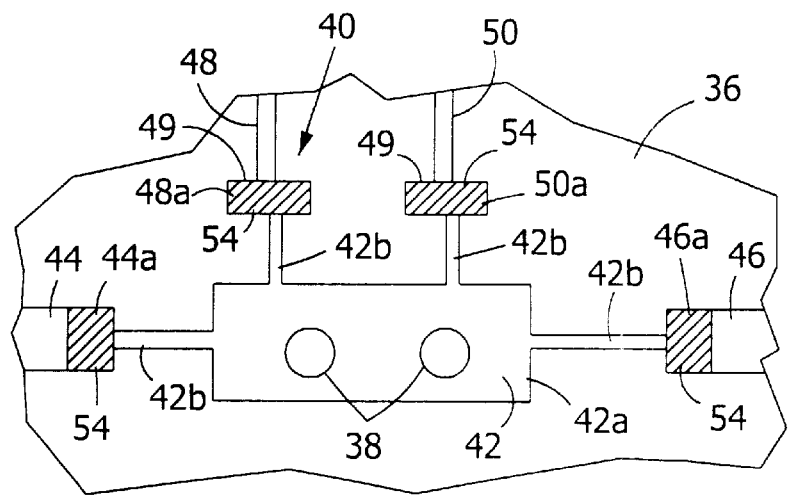
FIG. 8 is a plan view of the portion of the portion of the circuit board substrate of FIG. 7 with the second pattern of photoresist removed to show the circuit pattern with the terminal pads.
Figure 9:
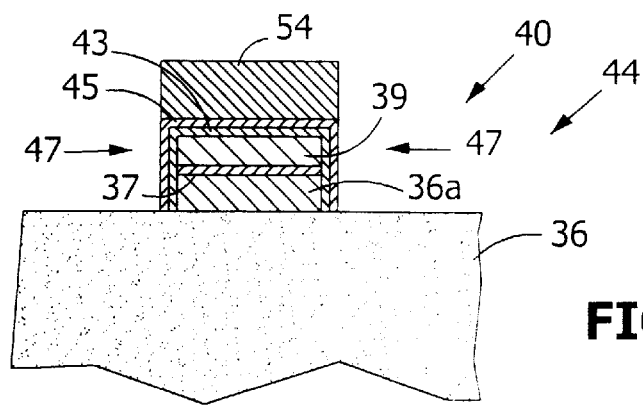
FIG. 9 is a side sectional a view of the portion of the circuit board substrate of FIG. 6 depicting a terminal pad formed thereon.
Figure 10:
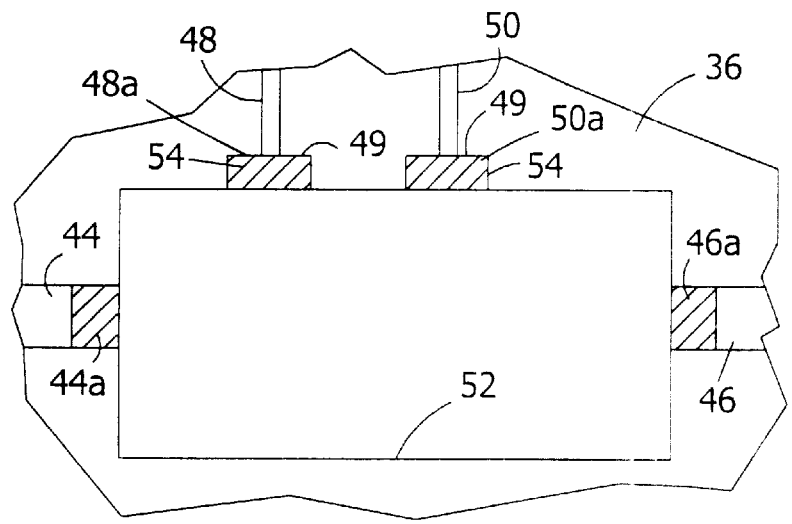
FIG. 10 is a plan view of the portion of the circuit board substrate of FIG. 8 with the temporary bussing pathways routed out.

In step 32 (FIG. 1), the second layer of photoresist 56 is then removed in a bath to expose the circuit pattern 40 and thickened terminal pads 44*a*, 46*a*, 48*a*, and 50*a* (FIGS. 8 and 9). Terminal pads 44*a* and 46*a* are positioned at the ends of respective traces 44 and 46 adjacent to traces 42*b*. Terminal pads 48*a* and 50*a* are positioned over widened regions 49 at the ends of respective traces 48 and 50 adjacent to traces 42*b*. Finally, in Step 34, an opening 52 is routed out from substrate 36 near and between terminal pads 44*a*, 46*a*, 48*a*, and 50*a* (FIG. 10). The opening 52 removes the temporary bussing 42 including via holes 38, rectangular region 42*a* and traces 42*b* without employing an etching step. As a result, there are no subsequent process steps to affect the quality and definition of the side edges of circuit pattern 40. The opening 52 allows an electrical device to be positioned therein and the thickened terminal pads 44*a*, 46*a*, 48*a* and 50*a* allow the electrical device to be wire bonded thereto. Depending upon the application at hand, opening 52 may be a hole that extends completely through substrate 36 or may be merely a recess or pocket having a depth that is less than the thickness of substrate 36.

Since the circuit pattern in the present invention is etched from a relatively thin layer of metal, the etching time is relatively short and fine or delicate trace definition can be achieved without significant lateral etching and/or undercutting of the side edges. Longer etching times tend to allow the etchant to attack the side edges of the circuit traces resulting in ragged or undercut side edges which can affect the quality and performance of the circuit. This is important especially when forming circuits with delicate traces. The protective metallic layer further insures that the definition of the traces is not affected by subsequent process steps. Forming the terminal pads on the circuit pattern only at the locations required is both cost and time effective in comparison to prior art processes where large areas are first thickened and then later require etching. Finally, routing out the temporary bussing mechanically removes the temporary bussing and eliminates another etching step. This is desirable because additional etching steps after the formation of the circuit pattern can affect the quality of the edges of the traces. Circuits made in accordance with the present invention not only are high precision and high quality, but also can be manufactured with higher tolerances and with higher yields than by prior art methods.

In one embodiment, circuit board substrate 36 (FIG. 2) is preferably made of low loss, low dielectrical circuit board material, but alternatively, may be fiberglass, teflon or multifunctional epoxy, etc. Substrate 36 is preferably about 0.003 to 0.070 inches thick, but alternatively, may be less than 0.003 inches or greater than 0.070 inches. The base layers 36*a* of copper are preferably about 350 to 700 micro-inches (0.00035 to 0.0007 inches) thick. Layers 36*a* are preferably formed from foil that is rolled onto the underlying board material, but alternatively, may be formed by electrolytic deposition. Although two layers 36*a* are preferred, there may be instances where one layer 36*a* is desired.

The via holes 38 are preferably 13 to 20 mils in diameter. In some applications, some via holes 38 may be kept in the final circuit board configuration if desired. Although metallized via holes 38 are preferred for providing electrical continuity, alternatively, conductive pathways may be provided by mechanically inserting a series of conductive members through the substrate 36 which are in contact with layers 36*a*. In such a case, removal of the conductive members may be by routing or pushing the conductive members from the base substrate 36.

The thin layer of copper 37 formed by electroless copper deposition in step 14 is typically about 50 microinches thick. The thicker layer of copper 39 formed by electrolytic copper deposition in step 16 is typically about 100–150 microinches thick but may be greater. Although Steps 14 and 16 (FIG. 1) are preferred for depositing layers 37 and 39 over layers 36*a*, alternatively, Steps 14 and 16 can be replaced by a direct plating step which is an electroless process capable of depositing a thicker metallic layer than is possible with Step 14. The layers of nickel 43 and gold 45 forming the protective metallic layer (steps 24 and 26) are each about 50 to 150 microinches thick. The layer of gold 54 formed by electrolytic gold deposition in step 30 to provide the terminal pads 44*a*, 46*a*, 48*a* and 50*a* is about 80 to 100 microinches thick.

Although layers 36*a*, 37 and 39 are preferably copper, layers 36*a*, 37 and 39 may be formed of other suitable materials such as aluminum, silver or gold. In addition, although nickel is preferred as the first layer 43 of the protective metallic layer on the circuit pattern 40 (FIG. 6), other suitable metals may be employed such as palladium, silver or tin. In such cases, the materials forming layers 36*a*, 37, 39, 43, 45 and 54 are appropriately selected for compatibility. Finally, depending upon the materials chosen, the protective metallic layer may be formed from a single layer of material instead of an inner barrier layer and an outer layer.

Figure 11:
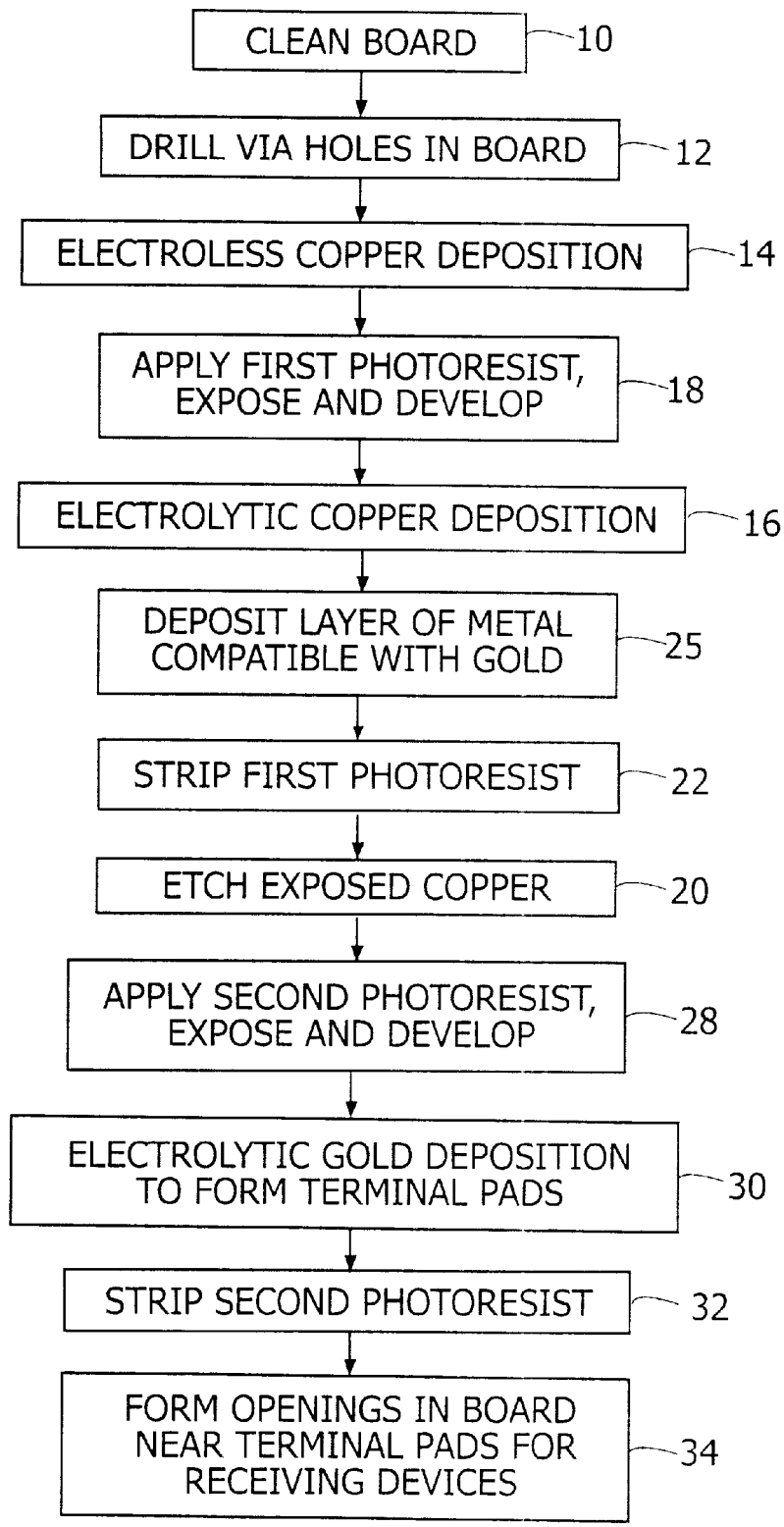
FIG. 11 is a flow chart depicting the steps of another method for fabricating electronic circuits.

FIG. 11 depicts another method for forming a circuit in accordance with the present invention. Generally, instead of plating a whole panel as performed in Step 16 of FIG. 1, the method depicted in FIG. 11 plates a desired pattern defined by photoresist. Consequently, some of the process steps in FIG. 11 are performed in a different order than in FIG. 1. For example, in FIG. 11, after depositing a thin layer of electroless copper in Step 14, a first photoresist layer is deposited, exposed and developed in Step 18. Then in Step 16, a thick layer of copper is deposited by electrolytic copper deposition in a desired pattern defined by the photoresist. The thickened patterned layer of copper is in the configuration of the desired circuit pattern. Next, in Step 25, a layer of metal (or metals) compatible with gold is deposited over the metallic pattern for providing a protective metallic layer similar to that provided in FIG. 1 by Steps 24 and 26. This protective layer typically covers only the top surface. The first photoresist layer is stripped in Step 22 and the exposed copper is etched in Step 20 to form the circuit pattern. The second layer of photoresist may then be deposited, exposed, and developed in Step 28 in preparation for the formation of terminal pads as in FIG. 1.

While this invention has been particularly shown and described with references to preferred embodiments thereof, it will be understood by those skilled in the art that various changes in form and details may be made therein without departing from the scope of the invention encompassed by the appended claims.

For example, although a particular circuit pattern 40 has been depicted in the figures, it is understood that any circuit pattern may be formed and that there may be multiple circuit patterns on one or both sides of circuit board substrate 36. In addition, although via holes 38 are depicted in the figures and described above, the via holes 38 may be omitted in certain instances. In such cases, steps 14 and 16 of FIG. 1 may be omitted or altered to suit the situation at hand. It is understood that the configuration and locations of the temporary bussing 42 may vary between circuits. Although the temporary bussing 42 including the via holes 38 is preferably removed by routing, alternatively, such areas maybe removed by drilling, punching, another etching step or laser ablation. Furthermore, although specific dimensions have been provided for circuit pattern 40, such dimensions may vary depending upon the situation at hand. Finally, various features of the fabrication methods depicted in the figures and described above may be omitted, substituted or combined, depending upon the situation at hand.

What is claimed is:

1. A method of forming a circuit comprising the steps of:
    forming a metallic circuit pattern on a base substrate, the circuit pattern having traces which are connected together by temporary bussing;
    forming a resist pattern for defining at least one terminal pad over the circuit pattern;
    forming a layer of metal on at least one area of the circuit pattern exposed by the resist pattern to a thickness suitable for serving as the at least one terminal pad for the circuit; and
    removing a portion of the base substrate at the location of the temporary bussing thereby causing the removal of the temporary bussing.

2. The method of claim 1 in which the step of forming the metallic circuit pattern comprises:
    providing the base substrate with a metallic layer thereon;
    forming a first resist pattern over the metallic layer on the base substrate for defining the circuit pattern;
    etching areas of the metallic layer from the base substrate exposed by the first resist pattern thereby forming the metallic circuit pattern under the first resist pattern;
    stripping the first resist pattern from the base substrate to uncover the circuit pattern, the circuit pattern having side edges; and
    covering the circuit pattern and side edges thereof with a protective metallic layer.

3. The method of claim 2 in which the step of covering the circuit pattern with the protective metallic layer comprises:
    forming a metallic inner barrier layer over the circuit pattern and side edges thereof by electroless deposition; and
    forming a metallic outer layer over the barrier layer by electroless deposition.

4. The method of claim 1 in which the base substrate has opposing sides each with a metallic layer thereon, the method further comprising the steps of:
    before forming the metallic circuit pattern, forming at least one via hole through the base substrate; and
    forming a conductive pathway through the at least one via hole to provide electrical continuity between the metallic layers on the opposing sides of the base substrate, the conductive pathway for becoming part of the temporary bussing.

5. The method of claim 4 in which the conductive pathway is formed by the steps of:
    forming a thin metallic layer within the at least one via hole by electroless deposition; and
    forming a thick metallic layer over the thin layer within the at least one via hole by electrolytic deposition.

6. The method claim 4 in which the step of removing the portion of the base substrate for removing the temporary bussing further comprises removing the at least one via hole.

7. The method of claim 1 in which the step of forming the layer of metal on the at least one area of the circuit pattern exposed by the resist pattern to a thickness suitable for serving as the at least one terminal pad comprises depositing the layer by electrolytic deposition.

8. The method of claim 1 further comprising the step of stripping the resist pattern from the base substrate.

9. The method of claim 1 in which the step of forming the metallic circuit pattern comprises:
    providing the base substrate with a metallic layer thereon;
    forming a first resist pattern over the metallic layer on the base substrate for defining the circuit pattern;
    increasing the thickness of the metallic layer in areas of the base substrate exposed by the first resist pattern;
    covering the areas exposed by the first resist pattern with a protective metallic layer;
    stripping the first resist pattern from the base substrate; and
    etching areas from the base substrate not protected by the protective metallic layer thereby forming the metallic circuit pattern.

10. A method of forming a circuit comprising the steps of:
    providing a base substrate having a metallic layer thereon;
    forming a first resist pattern over the metallic layer on the base substrate for defining a circuit pattern;
    etching areas of the metallic layer from the base substrate exposed by the first resist pattern thereby forming the circuit pattern under the first resist pattern, the circuit pattern including traces with side edges which are connected together by temporary bussing;
    striping the first resist pattern from the base substrate to uncover the circuit pattern;
    covering the circuit pattern and side edges thereof with a protective metallic layer;
    forming a second resist pattern for defining at least one terminal pad over the circuit pattern;
    forming a layer of metal on at least one area of the circuit pattern exposed by the second resist pattern to a thickness suitable for serving as the at least one terminal pad for the circuit; and
    removing a portion of the base substrate at the location of the temporary bussing thereby causing the removal of the temporary bussing, the removed portion for receiving an electrical device.

11. The method of claim 10 in which the step of covering the circuit pattern with the protective metallic layer comprises:
    forming a metallic inner barrier layer over the circuit pattern and side edges thereof by electroless deposition; and
    forming a metallic outer layer over the barrier layer by electroless deposition.

12. The method of claim 10 in which the base substrate has opposing sides each with a metallic layer thereon, the method further comprising the steps of:

before forming the circuit pattern, forming at least one via hole through the base substrate; and forming a conductive pathway through the at least one via hole to provide electrical continuity between the metallic layers on the opposing sides of the base substrate, the conductive pathway becoming part of the temporary bussing.

13. The method of claim 12 in which the conductive pathway is formed by the steps of:

forming a thin metallic layer within the at least one via hole by electroless deposition; and forming a thick metallic layer over the thin layer within the at least one via hole by electrolytic deposition.

14. The method of claim 12 in which the step of removing the portion of the base substrate for removing the temporary bussing further comprises removing the at least one via hole.

15. The method of claim 10 in which the step of forming the layer of metal on the at least one area of the circuit pattern exposed by the second resist pattern to a thickness suitable for serving as the at least one terminal pad comprises depositing the layer by electrolytic deposition.

16. The method of claim 10 further comprising the step of stripping the second resist pattern from the base substrate.

17. A method of forming a circuit comprising the steps of:

providing a base substrate having opposing sides, each with a metallic layer thereon;

forming at least one via hole through the base substrate;

forming a conductive pathway through the at least one via hole to provide electrical continuity between the metallic layers on the opposing sides of the base substrate;

forming a first resist pattern over the metallic layers of the base substrate for defining a circuit pattern;

etching metallic areas exposed by the first resist pattern from the base substrate thereby forming the circuit pattern under the first resist pattern, the circuit pattern including traces with side edges which are connected together by temporary bussing, the temporary bussing including the at least one via hole;

striping the first resist pattern from the base substrate to uncover the circuit pattern;

covering the circuit pattern and side edges thereof with a protective metallic layer;

forming a second resist pattern for defining at least one terminal pad over the circuit pattern;

forming a layer of metal on at least one area of the circuit pattern exposed by the second resist pattern to a thickness suitable for serving as the at least one terminal pad for the circuit; and removing a portion of the base substrate at the location of the temporary bussing thereby causing the removal of the temporary bussing and the at least one via hole, the removed portion for receiving an electrical device.

18. The method of claim 17 in which the metallic layers of the base substrate are copper, the conductive pathway being formed by the steps of:

forming a thin layer of copper within the at least one via hole by electroless deposition; and forming a thick layer of copper over the thin layer within the at least one via hole by electrolytic deposition.

19. The method of claim 18 in which the step of covering the circuit pattern with the protective metallic layer comprises:

forming an inner barrier layer of nickel over the circuit pattern and side edges thereof by electroless deposition; and forming an outer layer of gold over the inner barrier layer of nickel by electroless deposition.

20. The method of claim 17 in which the step of forming the layer of metal on the at least one area of the circuit pattern exposed by the second resist pattern to a thickness suitable for serving as the at least one terminal pad comprises depositing the layer by electrolytic gold deposition.

21. The method of claim 17 further comprising the step of stripping the second resist pattern from the base substrate.

22. A method of forming a circuit comprising the steps of:

providing a base substrate having a metallic layer thereon;

forming a first resist pattern over the metallic layer on the base substrate for defining a circuit pattern;

increasing the thickness of the metallic layer in areas of the base substrate exposed by the first resist pattern;

covering the areas exposed by the first resist pattern with a protective metallic layer;

stripping the first resist pattern from the base substrate;

etching areas from the base substrate not protected by the protective metallic layer thereby forming the metallic circuit pattern, the circuit pattern having traces which are connected together by temporary bussing;

forming a second resist pattern for defining at least one terminal pad over the circuit pattern;

forming a layer of metal on at least one area of the circuit pattern exposed by the second resist pattern to a thickness suitable for serving as the at least one terminal pad for the circuit; and removing a portion of the base substrate at the location of the temporary bussing thereby causing the removal of the temporary bussing, the removed portion for receiving an electrical device.

* * * * *